United States Patent [19]

Ishibata

[11] Patent Number: 5,798,954
[45] Date of Patent: Aug. 25, 1998

[54] DIGITAL FILTER DEVICE HAVING A BIT SHIFTER UNIT

[75] Inventor: Naomasa Ishibata, Kobe, Japan

[73] Assignee: Ricoh Company, Ltd., Tokyo, Japan

[21] Appl. No.: 730,504

[22] Filed: Oct. 11, 1996

[30] Foreign Application Priority Data

Oct. 13, 1995 [JP] Japan ............... 7-265831

[51] Int. Cl.$^6$ ............... G06F 17/10
[52] U.S. Cl. ............... 364/724.17
[58] Field of Search ............... 364/724.17, 724.03, 364/724.16; 235/152; 395/800

[56] References Cited

U.S. PATENT DOCUMENTS

| | | | |
|---|---|---|---|
| 3,967,099 | 6/1976 | Fettweis | 235/152 |
| 4,213,187 | 7/1980 | Lawrence et al. | 364/724 |
| 4,305,133 | 12/1981 | Amada et al. | 364/724 |
| 4,321,685 | 3/1982 | Kasuga et al. | 364/724 |
| 4,356,559 | 10/1982 | Candy et al. | 364/724 |
| 4,791,597 | 12/1988 | Miron et al. | 364/724.03 |
| 4,920,507 | 4/1990 | Takeda | 364/724.17 |
| 5,339,264 | 8/1994 | Said et al. | 364/724.16 |
| 5,381,358 | 1/1995 | Sakamoto | 364/724.17 |
| 5,477,479 | 12/1995 | Ochi | 364/760 |
| 5,499,375 | 3/1996 | Miyaguchi | 395/800 |
| 5,523,962 | 6/1996 | Yoshino et al. | 364/724.16 |

FOREIGN PATENT DOCUMENTS

| | | |
|---|---|---|
| 63-224408 | 9/1988 | Japan . |
| 1145699 | 6/1989 | Japan . |
| 5219475 | 8/1993 | Japan . |

*Primary Examiner*—Reba I. Elmore
*Assistant Examiner*—Monica Lewis
*Attorney, Agent, or Firm*—Cooper & Dunham LLP

[57] ABSTRACT

A digital filter device includes an adder, a delay connected to the adder, and at least one feedback line connected at one end to an output of the delay and at another end to an input of the adder. A sign inverting unit generates a sign-inverted value of a digital signal at an input of the sign inverting unit. A bit shifter unit generates a result of an operation of multiplication on a number in the form of $2^{-n}$ where n is a non-negative integer and a value of a digital signal at an input of the bit shifter unit, the bit shifter unit generating an output signal indicating the result of the operation by right shifting of n bits in the digital signal and by truncating n least significant bits of the digital signal.

12 Claims, 8 Drawing Sheets

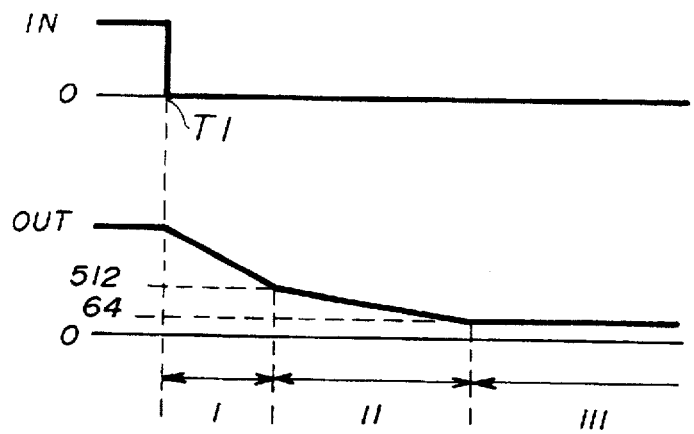
FIG.4A
FIG.4B
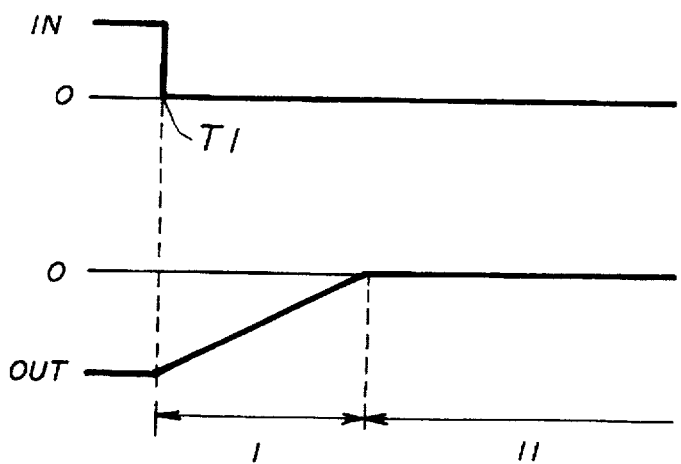
FIG.5A
FIG.5B
FIG.6 PRIOR ART
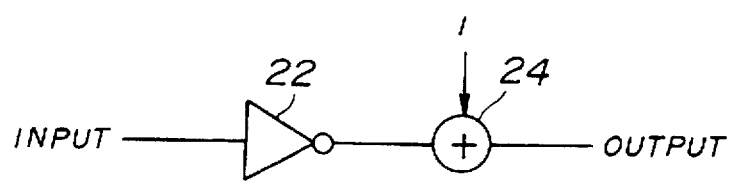

5,798,954

1

DIGITAL FILTER DEVICE HAVING A BIT SHIFTER UNIT

BACKGROUND OF THE INVENTION (1) Field of the Invention

The present invention generally relates to a digital filter device which is built on an integrated circuit as special-application hardware, and more particularly to an infinite-impulse-response filter device which outputs a processed signal in response to a digital signal with the elimination of limit cycles.

(2) Description of the Related Art

In the prior art, there are several approaches to realize a digital filter. One approach is to build a digital filter as special-application hardware. The hardware of the digital filter includes delay circuits, adder circuits, multiplier circuits, and others. Another approach is to realize a digital filter as software by utilizing a general-purpose computer. Still another approach is to realize a digital filter by utilizing a digital signal processor.

Among these approaches, the first approach, which is the building of the digital filter as the hardware, allows the processing time to be reduced and enables real-time processing to be performed. For this reason, the building of the digital filter as the hardware is considered advantageous, although it is difficult to incorporate additional functions and design modifications into the hardware of the digital filter after it is built.

The digital filter built as the hardware by the above approach is appropriate for applications in which a great number of filters having a high performance and the same specification are needed. When the digital filter is built on the IC chip as the hardware, it is important to reduce the size of the digital filter circuit on the IC chip.

Digital filters are classified into finite-impulse-response (FIR) filter devices and infinite-impulse-response (IIR) filter devices according to their impulse responses. The IIR filter devices usually have a feedback line and are commonly called recursive digital filters. The FIR filter devices have no feedback line and are commonly called non-recursive digital filters. Generally, when the two types are compared to each other in view of the circuit size, the IIR filter devices can be more easily constructed with a reduction of the circuit size. When a digital filter is built on the chip as the special-application hardware with a reduced size of the entire filter circuit on the chip, using the IIR filter device is desirable rather than using the FIR filter device.

Accordingly, it is conceivable to conduct the above-mentioned approach by using a conventional IIR filter device. However, some problems may arise when the conventional IIR filter device is built on the chip as the hardware, as follows.

When a conventional IIR filter device using a fixed-point representation is built on the chip as the hardware, degradation of the filter characteristics of the filter device may take place. FIG. 10 shows such a problem occurring in the conventional IIR filter device. As shown, the actual result of the filtering operation output by the conventional IIR filter device is different from the desired value of the filtering, and the difference between the actual result and the desired value will be on the order that is too great. In the case of the above filter device, the difference between the actual result and the desired value is oscillated as shown in FIG. 10, when the input signal to the filter device is abruptly set at zero and this state of the input signal is continuously held. This problem

2 of the above filter device is commonly called limit cycles. If the problem of the limit cycles occurs, the filter characteristics of the digital filter are considerably degraded.

In addition, when the conventional IIR digital filter is built on the IC chip as the hardware, multipliers and/or adders included in the digital filter make it difficult to reduce the size of the entire filter circuit on the chip. Especially, the size of the multipliers included in the conventional digital filter is great, and it makes it difficult to provide a reduced size of the entire filter circuit on the chip.

Further, when a design modification to increase or decrease the number of bits of a digital signal processed by the conventional IIR digital filter is required, it is necessary to completely change the design or layout pattern of the digital filter circuit with respect to each of the circuit elements such as multipliers, adders and registers. It is difficult to realize the design modification of the conventional IIR digital filter since a great amount of the processing time is required.

SUMMARY OF THE INVENTION

An object of the present invention is to provide an improved digital filter device in which the above-described problems are eliminated.

Another object of the present invention is to provide a digital filter device which avoids the limit cycles occurring in the conventional digital filter and effectively reduces the size of the entire filter circuit the circuit elements of which are built on the chip as the special-application hardware.

Still another object of the present invention is to provide a digital filter device which provides a reduced size of the entire filter circuit by decreasing the number of circuit elements which are built on the chip as the special-application hardware.

A further object of the present invention is to provide a digital filter device which allows a design modification for increasing or decreasing the number of bits of a digital signal in the digital filter device to be easily performed with a reduction of the processing time.

The above-mentioned objects of the present invention are achieved by a digital filter device which includes: an adder; a delay connected to the adder; at least one feedback line connected at one end to an output of the delay and at another end to an input of the adder; a sign inverting unit generating a sign-inverted value of a digital signal input to the sign inverting unit; and a bit shifter unit generating a result of an operation of multiplication on a number in the form of $2^{-n}$ where n is a non-negative integer and a value of a digital signal input to the bit shifter unit, the bit shifter unit generating an output signal indicating the result of the operation by right shifting of n bits in the digital signal and by truncating n least significant bits of the digital signal.

The above-mentioned objects of the present invention are achieved by a digital filter device which includes: a plurality of unit filter circuits generating an output signal indicating a result of a filtering operation of respective bits of a digital signal wherein each unit filter circuit is provided for one of the bits of the digital signal and comprises a unit adder, a unit register connected to the unit adder, and at least one feedback line connected at one end to an output of the unit register and at another end to an input of the unit adder; and a bit shifter unit generating a result of an operation of multiplication on a number in the form of $2^{-n}$ where n is a non-negative integer and a value of a digital signal at an input of the bit shifter unit, the bit shifter unit generating an output signal indicating the result of the operation by right shifting of n bits in the digital signal and by truncating n least significant bits of the digital signal.

The digital filter device of the present invention includes the bit shifter unit which generates the result of the operation of multiplication by right shifting of n bits in the digital signal and by truncating n least significant bits of the digital signal. The present invention eliminates the multiplier used in the conventional digital filter device. It is possible for the present invention to avoid the limit cycles occurring in the conventional digital filter and effectively reduce the size of the entire filter circuit built on the chip as the special-application hardware.

The digital filter device of the present invention includes the sign inverting unit which generates a sign-inverted value of a digital signal as the complement of one with respect to the value of the digital signal, in order to eliminate an adder used by a sign inverter of the conventional digital filter device. It is possible for the present invention to provide a reduced size of the entire filter circuit by decreasing the number of circuit elements which are built on the chip as the special-application hardware.

The digital filter device of the present invention includes the plurality of unit filter circuits which generate the output signal indicating the result of the filtering operation of respective bits of a digital signal. It is possible for the present invention to easily carry out a design modification for increasing or decreasing the number of bits of the digital signal processed by the digital filter device, with a reduction of the processing time.

BRIEF DESCRIPTION OF THE DRAWINGS

Other objects, features and advantages of the present invention will become more apparent from the following detailed description when read in conjunction with the accompanying drawings in which:

FIGS. 4A and 4B are waveform charts for explaining an example of the operation of the IIR filter device in FIGS. 3A, 3B and 3C;

FIGS. 5A and 5B are waveform charts for explaining another example of the operation of the IIR filter device in FIGS. 3A, 3B and 3C;

FIG. 6 is a block diagram of a sign inverter of a conventional digital filter device;

DETAILED DESCRIPTION OF THE PREFERRED EMBODIMENTS

A description will now be given of the preferred embodiments of the present invention with reference to the accompanying drawings.

Figure 3A:
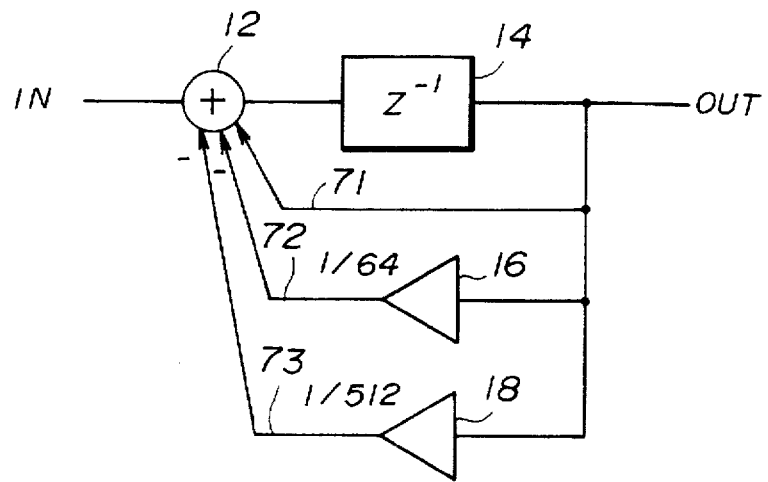
FIGS. 3A, 3B and 3C are block diagrams of an infinite-impulse-response (IIR) filter device in one embodiment of the present invention.

FIG. 3A shows an infinite-impulse-response (IIR) filter device in one embodiment of the present invention. Referring to FIG. 3A, the IIR filter device comprises an input terminal, an output terminal, at least one feedback line, an adder 12, a unit delay 14, a $2^{-6}$ coefficient unit 16, and a $2^{-9}$ coefficient unit 18.

In the present embodiment, three feedback lines which connect an output of the unit delay 14 to an input of the adder 12 are provided: a first feedback line 71, a second feedback line 72 and a third feedback line 73. No circuit element is provided on the first feedback line 71. The $2^{-6}$ coefficient unit 16 is provided on the second feedback line 72 by connecting an input of the coefficient unit 16 to the output of the unit delay 14 and connecting an output of the coefficient unit 16 to the input of the adder 12. The $2^{-9}$ coefficient unit 18 is provided on the third feedback line 73 by connecting an input of the coefficient unit 18 to the output of the unit delay 14 and connecting an output of the coefficient unit 18 to the input of the adder 12.

An input signal IN at the input terminal is supplied to the adder 12. An output signal OUT is generated at the output of the unit delay 14 and the output signal OUT is supplied to the output terminal. In addition, the output signal OUT at the output of the unit delay 14 is supplied to the adder 12 through the first feedback line 71 and added to the input signal IN by the adder 12. Further, the output signal at the output of the unit delay 14 is multiplied by $2^{-6}$ by the coefficient unit 16, and supplied to the adder 12 through the second feedback line 72. The resulting signal at the output of the coefficient unit 16 is subtracted from the input signal IN by the adder 12. Further, the output signal at the output of the unit delay 14 is multiplied by $2^{-9}$ by the coefficient unit 18, and supplied to the adder 12 through the third feedback line 73. The resulting signal at the output of the coefficient unit 18 is subtracted from the input signal IN by the adder 12. Thus, a signal which indicates the result of the above addition and subtractions is generated at the output of the adder 12, and the signal is supplied to the output terminal through the unit delay 14. The resulting signal at the output of the unit delay 14 is the output signal OUT at the output terminal.

The IIR filter device in FIG. 3A provides a result of a filtering operation of the digital signal by using a fixed-point representation, in order to provide a reduced size of the entire filter circuit built as the special-application hardware.

Generally, in a digital filter device, an arithmetic operation of multiplication on one of coefficients of a transfer function of the digital filter device and a value of a digital signal is carried out. In the digital filter device of the present embodiment, each of the coefficients of the transfer function is represented by a number in the form of $2^{-n}$ or $-2^{-n}$ where n is a non-negative integer (0, +1, +2, . . . ). The arithmetic operation of multiplication on one of the coefficients of the transfer function and the digital signal value is performed in the present embodiment by bit shifting of the digital signal.

For example, in the IIR filter device in FIG. 3A, $2^{-6}$ (=1/64) represents one of the coefficients of the transfer function, and the operation of multiplication on $2^{-6}$ and the digital signal value is performed by the $2^{-6}$ coefficient unit 16, which will be described as follows.

Figure 1A:
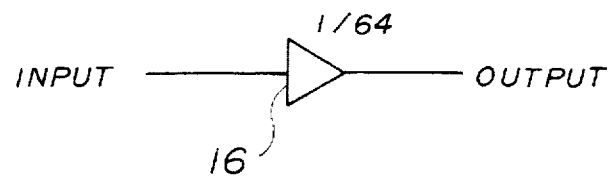
FIGS. 1A, 1B and 1C are diagrams of a $2^{-n}$ coefficient unit of a digital filter device to which the present invention is applied.

FIG. 1A shows the $2^{-6}$ coefficient unit 16 in FIG. 3A. In the present embodiment, the $2^{-6}$ coefficient unit 16 is constructed by a bit shifter unit which carries out the arithmetic operation of 6-bit right shifting of a digital signal input to the bit shifter unit. The coefficient "1/64" of the transfer function is represented by $2^{-6}$.

Figure 1B:

FIG. 1B is a diagram showing the bit shifter unit corresponding to the $2^{-6}$ coefficient unit 16 in FIG. 1A. As shown in FIG. 1B, the diagram of the bit shifter unit is labeled "6-BIT RIGHT SHIFTER".

Figure 1C:
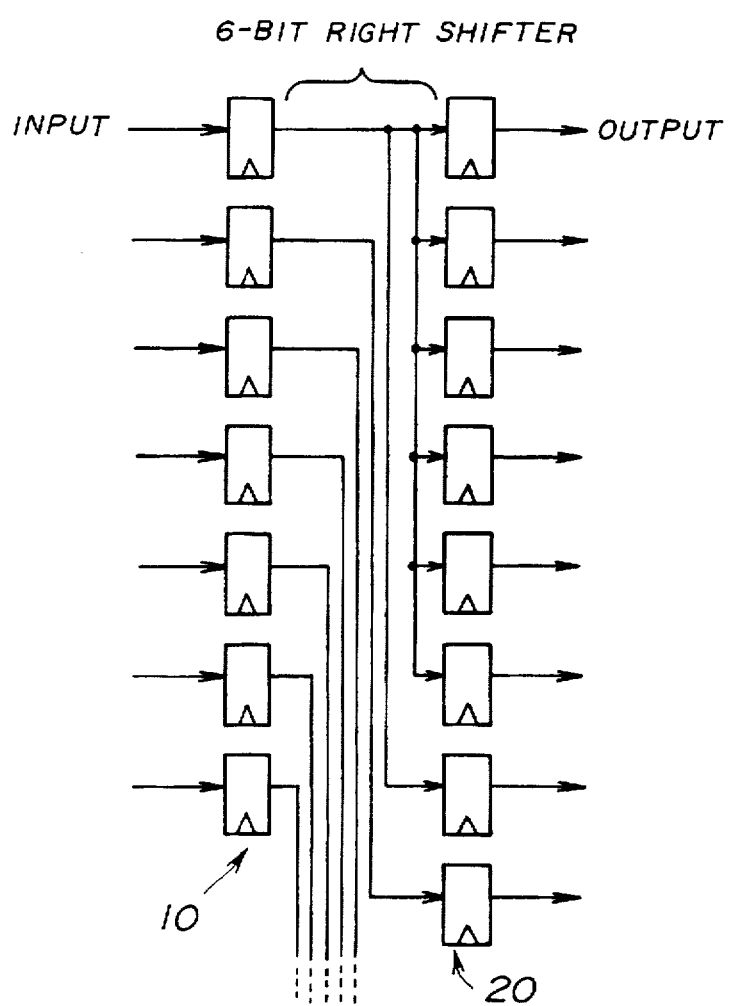

FIG. 1C shows a set of connecting wires between output terminals of an input register 10 and input terminals of an output register 20, which realizes the bit shifter unit in FIG. 1B. In FIG. 1C, the input register 10 and the output register 20 are external circuits which are externally connected to the inputs and outputs of the bit shifter unit.

As shown in FIG. 1C, the connecting wire from the output terminal of the input register 10 for the most significant bit of an input signal is connected to each of the six input terminals of the output register 20 for the six most significant bits of an output signal, and this connecting wire is further connected to the next input terminal of the output register 20 at the 6-bit right shifted position. The connecting wires from the other output terminals of the input register 10 are respectively connected to the input terminals of the output register 20 corresponding to the 6-bit right shifted positions.

Figure 2:
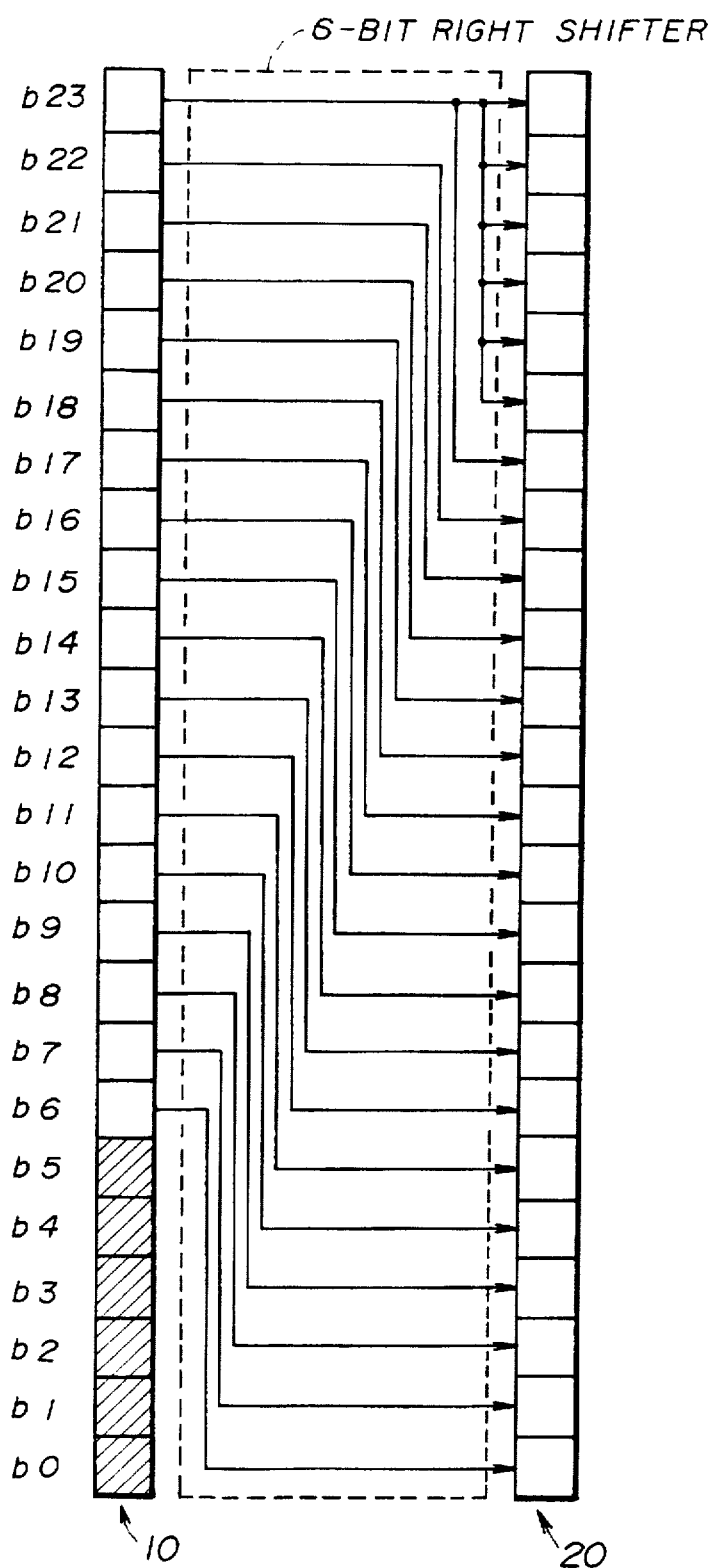
FIG. 2 is a circuit diagram of an example of the $2^{-n}$ coefficient unit in FIG. 1A.

FIG. 2 shows a set of connecting wires between the output terminals of the input register 10 and the input terminals of the output register 20 in a case in which a digital signal processed by the $2^{-6}$ coefficient unit 16 consists of 24 bits. The $2^{-6}$ coefficient unit 16 in FIG. 3A is constructed by using the plurality of connecting wires in FIG. 2 according to the present invention.

Referring to FIG. 2, a 6-bit right shifter unit which realizes the $2^{-6}$ coefficient unit 16 is constructed by using the set of connecting wires. The arithmetic operation of multiplication on the coefficient 1/64 of the transfer function and the 24-bit digital signal value is performed by right shifting of 6 bits in the digital signal.

The above-described bit shifter unit in FIG. 2 carries out the arithmetic operation of 6-bit right shifting of the 24-bit digital signal, and provides a result of the arithmetic operation of multiplication on the coefficient 1/64 and the digital signal value. As shown in FIG. 2, the six least significant bits of the digital signal at the output terminals "b0" through "b5" of the input register 10 (which are indicated by shading lines in FIG. 2) are truncated. These bits are removed or truncated from the result of the operation of the multiplication. The most significant bit of the digital signal at the output terminal "b23" of the input register 10 is loaded in the six most significant bits of the output signal at corresponding output terminals of the output register 20, and it is further loaded in the next bit of the output signal at the output terminal of the output register 20 corresponding to the 6-bit right shifted position. Further, the other bits of the digital signal at the output terminals "b22" through "b6" of the input register 10 are loaded in the 6-bit right shifted bits of the output signal at corresponding output terminals of the output register 20.

According to the above bit shifter unit, the arithmetic operation of multiplication on the coefficient 1/64 of the transfer function and the 24-bit digital signal is carried out, and the output signal indicating the result of the operation of the multiplication is transferred to the output register 20. The six least significant bits of the digital signal which is input from the output terminals "b0" through "b5" of the input register 10 to the above bit shifter unit are truncated.

The embodiment of the bit shifter unit in FIG. 2 is the case in which the $2^{-6}$ coefficient unit 16 processes the 24-bit digital signal. Similarly, the bit shifter unit according to the present invention for the case of $2^{-n}$ coefficient unit where n is a non-negative integer (for example, the $2^{-9}$ coefficient unit 18 in FIG. 3A) can be constructed by using a set of connecting wires as shown in FIG. 2. The bit shifter unit for the $2^{-n}$ coefficient unit provides an output signal indicating the result of the arithmetic operation of multiplication on $2^{31}$ n as one of the coefficients of the transfer function and the digital signal value. The n least significant bits of the digital signal input to the bit shifter unit are truncated.

Figure 10:
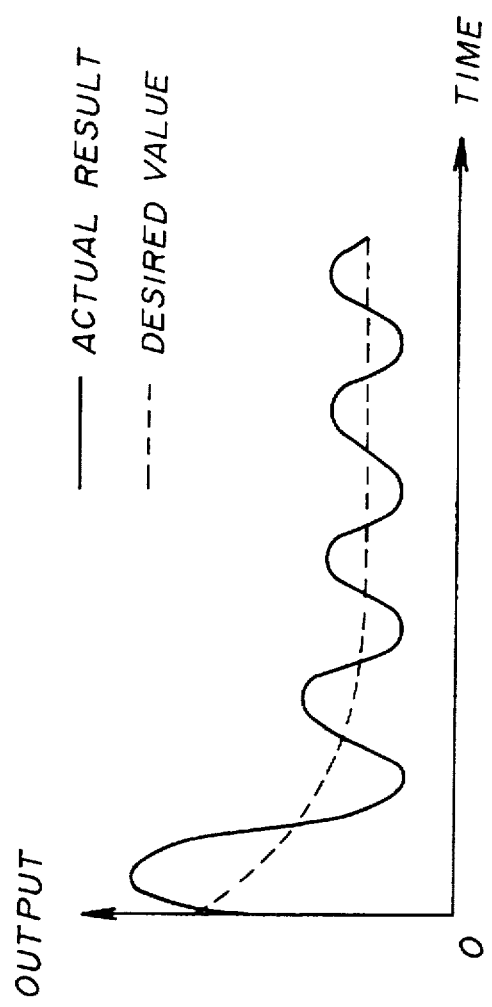
FIG. 10 is a waveform chart for explaining the limit cycles occurring in a conventional IIR filter device.

The IIR filter device in FIG. 3A includes the feedback lines 71, 72 and 73. Generally, when a conventional IIR filter device having at least one feedback line provides a result of a filtering operation of a digital signal by using a fixed-point representation, the problem of the limit cycles may arise as previously described with reference to FIG. 10. However, the IIR filter device of the present embodiment eliminates the problem of the limit cycles since it includes the above-described bit shifter unit. This will be described in the following.

For the purpose of simplicity, suppose herein that the digital signal processed by the IIR filter device of the present embodiment indicates a value of an integer. This supposition is correct if the IIR filter device provides the result of the filtering operation of the digital signal by using a fixed-point representation.

Figure 3B:
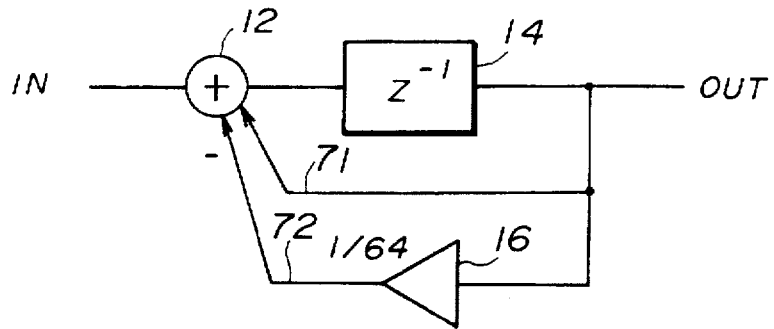
Figure 3C:
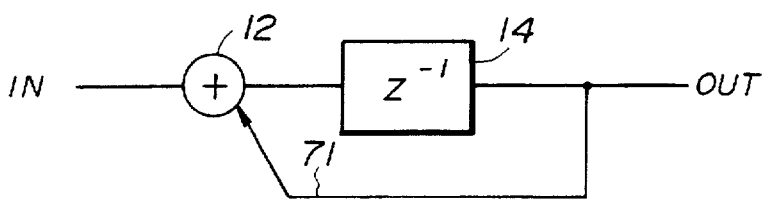

FIGS. 4A and 4B show an example of the operation of the IIR filter device in FIGS. 3A, 3B and 3C.

In the operation of the IIR filter device in FIGS. 4A and 4B, the value of the output signal OUT from the IIR filter device is positive and the input signal IN to the IIR filter device is set at zero at a time T1. If the zero state of the input signal IN is continuously held, the value of the output signal OUT is gradually decreased. This period is indicated by an arrow I in FIG. 4B.

When the value of the output signal OUT is below 512 (=$2^9$), an output signal indicating zero is generated at the output of the $2^{-9}$ coefficient unit 18. The bit shifter unit for the $2^{-9}$ coefficient unit 18 provides an output signal indicating the result of the operation of multiplication on $2^{-9}$ and the input signal value; and the nine least significant bits of the input signal are truncated. At this time, the signal passed through the third feedback line 73 may be ignored.

Consequently, when the value of the output signal OUT is below 512, the IIR filter device in FIG. 3A is equivalent to an IIR filter device in FIG. 3B. The value of the output signal OUT is further gradually decreased from 512. This period is indicated by an arrow II in FIG. 4B.

When the value of the output signal OUT is below 64 (=$2^6$), an output signal indicating zero is generated at the output of the $2^{-6}$ coefficient unit 16. The bit shifter unit for the $2^{-6}$ coefficient unit 16 provides an output signal indicating the result of the operation of multiplication on $2^{-6}$ and the input signal value, and the six least significant bits of the input signal are truncated. At this time, the signal passed through the second feedback line 72 may be ignored.

Consequently, when the value of the output signal OUT is below 64, the IIR filter device in FIG. 3B is equivalent to an IIR filter device in FIG. 3C. The value of the output signal OUT is finally equal to 63 (=64−1), and this state of the output signal OUT is continuously held after then. This period is indicated by an arrow III in FIG. 4B.

FIGS. 5A and 5B show another example of the operation of the IIR filter device in FIGS. 3A, 3B and 3C.

In the operation of the IIR filter device in FIGS. 5A and 5B, the value of the output signal OUT from the IIR filter device is negative and the input signal IN to the IIR filter device is set at zero at a time T1. If the zero state of the input signal IN is continuously held, the value of the output signal OUT is gradually increased to zero. The absolute value of the output signal OUT is gradually decreased. This period is indicated by an arrow I in FIG. 5B.

During the period I, a negative value of the output signal OUT is always indicated by the complement of 2. When the absolute value of the output signal OUT is decreased but not equal to zero, not only an output signal indicating a non-zero value is generated at the output of the $2^{-6}$ coefficient unit 16 but also an output signal indicating a non-zero value is generated at the output of the $2^{-9}$ coefficient unit 18. If the absolute value of the output signal OUT is below a certain value, the $2^{-6}$ coefficient unit 16 and the $2^{-9}$ coefficient unit 18 output signals with all bits "one" since the several least significant bits of the input signal are truncated when the bit shifting of the input signal is performed. The output signals with all the bits "one" are generated by the bit shifter units of the $2^{-6}$ coefficient unit 16 and the $2^{-9}$ coefficient unit 18 since the output signals are indicated by the complement of 2 with respect to the input signal value "−1".

When the value of the output signal OUT is equal to zero, an output signal indicating zero is generated at the output of the 2−9 coefficient unit 18 as well as at the output of the $2^{-6}$ coefficient unit 16. The zero state of the output signal OUT is continuously held after then. This period is indicated by an arrow II in FIG. 5B.

Accordingly, the IIR filter device of the present embodiment eliminates the problem of the limit cycles. However, when the value of the output signal OUT at the time T1 is positive and above 64, a direct-current (DC) offset between the input and output terminals of the IIR filter device finally takes place as an error of the filtering operation during the period III in FIG. 4B.

This DC offset is easily eliminated by providing a DC offset cutting circuit in an external analog circuit externally connected to the IIR filter device of the present embodiment. The DC offset cutting circuit is, for example, a capacitor connected to the IIR filter device in series.

In the above example, the operation of the IIR filter device when the input signal IN to the IIR filter device is set at zero at the time T1 and the zero state of the input signal IN is continuously held, has been taken into account. However, even when the input signal IN is set at a non-zero value at the time T1, the IIR filter device of the present invention operates in a similar manner so as to eliminate the problem of the limit cycles, although the DC offset between the input and output terminals of the IIR filter device may take place as the error of the filtering operation.

In the above-described embodiment, a multiplier used by the conventional IIR filter device is replaced by the bit shifter unit. As described above, the problem of the limit cycles occurring in the conventional IIR filter device is eliminated by the bit shifter unit of the present embodiment. The bit shifter unit generates the result of the operation of multiplication by right shifting of n bits in the digital signal and by truncating n least significant bits of the digital signal. The bit shifter unit is constructed by using the plurality of connecting wires as shown in FIG. 1C.

Accordingly, it is possible for the present embodiment to avoid the limit cycles occurring in the conventional digital filter and effectively reduce the size of the entire filter circuit built on the chip as the special-application hardware. Also, it is possible for the present embodiment to reduce the processing time when building the digital filter device on the chip as the special-application hardware.

Referring back to FIG. 3A, the IIR filter device of the present embodiment includes a sign inverting unit which generates a sign-inverted value of a digital signal at an input of the sign inverting unit. For example, the IIR filter device of the present embodiment includes a sign inverting unit which provides a sign-inverted value of a digital signal at the output of the $2^{-6}$ coefficient unit 16.

In the present embodiment, each of the coefficients of the transfer function of the IIR filter device is represented by a number in the form of $2^{-n}$ or $-2^{-n}$ where n is a non-negative integer. The IIR filter device of the present embodiment generates the result of the filtering operation of the digital signal by using the fixed-point representation.

FIG. 6 shows a conventional sign inverting unit used by the conventional IIR filter device.

As shown in FIG. 6, the conventional sign inverting unit includes an inverter 22 and an adder 24 having an input connected to an output of the inverter 22. In the conventional sign inverting unit, the inverter 22 generates a plurality of bit signals indicating inversions of respective bits of a digital signal "INPUT" at an input of the inverter 22. The value "1" at another input of the adder 24 is added to the bit signals output from the inverter 22. Thus, an output signal "OUTPUT" indicating a sign-inverted value of the input signal is generated at an output of the adder 24. The conventional sign inverting unit generates the output signal OUTPUT as the complement of two with respect to the value of the input signal INPUT.

In contrast, the sign inverting unit of the present embodiment generates the output signal as the complement of one with respect to the value of the input signal. In the IIR filter device in FIG. 3A, the $2^{-6}$ coefficient unit 16 and the sign inverting unit are included in one unit as a $-2^{-6}$ coefficient unit which is shown in FIG. 7A.

Figure 7A:
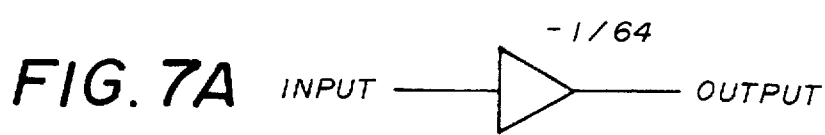
FIGS. 7A, 7B and 7C are diagrams showing an inverting and multiplying unit of the IIR filter device.

Referring to FIG. 7A, the $-2^{-6}$ coefficient unit generates an output signal "OUTPUT" indicating the result of the operation of multiplication on the negative value "−1/64" (=$-2^{-6}$) and a value of an input signal "INPUT". That is, the multiplication between $2^{-6}$ and the input signal value and the sign inversion of the result of the multiplication are carried out by the $-2^{-6}$ coefficient unit in FIG. 7A.

Figure 7B:
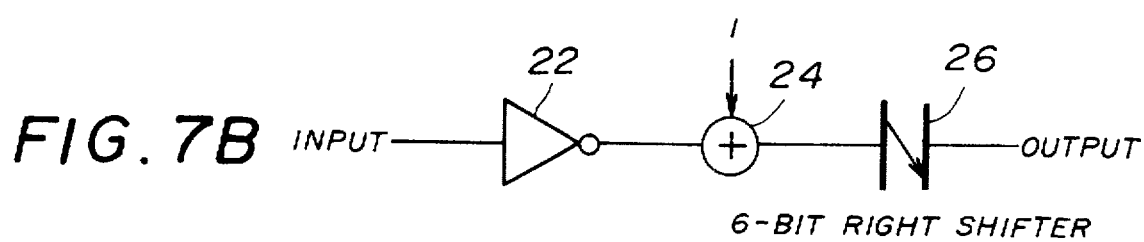

In order to construct the $-2^{-6}$ coefficient unit in FIG. 7A, it is conceivable that the conventional sign inverting unit (FIG. 6) including the inverter 22 and the adder 24 is connected to a 6-bit right shifter unit 26, as shown in FIG. 7B. In this $-2^{-6}$ coefficient unit, the multiplication between $2^{-6}$ and the digital signal value and the sign inversion of the result of the multiplication are carried out. The 6-bit right shifter unit 26 is constructed by using the plurality of connecting wires as shown in FIG. 1C or FIG. 2.

The 6-bit right shifter unit 26 in FIG. 7B generates the output signal OUTPUT indicating the result of the operation of multiplication on $2^{-6}$ and the sign-inverted value of the digital signal at the output of the adder 24, by right shifting of 6 bits in the digital signal. However, as described above, the 6-bit right shifter unit 26 truncates the six least significant bits of the digital signal. That is, the value "1" at the input of the adder 24, which is added to the least significant bit of the output signal of the inverter 22, is also truncated by the 6-bit right shifter unit 26. Therefore, in order to construct the $-2^{-6}$ coefficient unit in FIG. 7A by using a sign inverting unit and a bit shifter unit, it is not necessary to include the adder 24 in FIG. 7B.

Figure 7C:
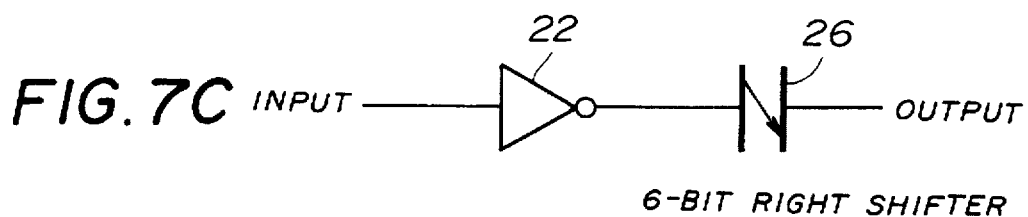

FIG. 7C shows a construction of the $-2^{-6}$ coefficient unit which is used by the IIR filter device of the present embodiment. As shown in FIG. 7C, the $-2^{-6}$ coefficient unit is constructed by using the inverter 22 and the 6-bit right shifter unit 26 which are directly connected in series. For the above-mentioned reason, the adder 24 in FIG. 7B is not included in the $-2^{-6}$ coefficient unit in FIG. 7C.

The $-2^{-6}$ coefficient unit in FIG. 7C generates a result of the operation of multiplication on $2^{-6}$ and a sign-inverted value of a digital signal at the output of the inverter 22. In the $-2^{-6}$ coefficient unit of the present embodiment, the inverter 22 generates a plurality of bit signals indicating inversions of respective bits of a digital signal "INPUT" at an input of the inverter 22. An intermediate digital signal indicating a sign-inverted value of the input signal "INPUT" is supplied to the 6-bit right shifter unit 26. The 6-bit right shifter unit 26 generates the output signal OUTPUT indicating the result of the operation of multiplication on $2^{-6}$ and the sign-inverted value of the digital signal at the output of the inverter 22, by right shifting of 6 bits in the digital signal.

Since the value "1" is not added to the intermediate digital signal output from the inverter 22, the sign inverting unit (the inverter 22) of the present embodiment generates the complement of one with respect to the value of the input signal INPUT. However, since the 6-bit right shifter unit 26 truncates the six least significant bits of the intermediate digital signal, the $-2^{-6}$ coefficient unit of the present embodiment generates the output signal OUTPUT which is the same as that indicated by the complement of two with respect to the sign-inverted value of the input signal INPUT.

In the above-described embodiment, the sign inverting unit generates a sign-inverted value of a digital signal as the complement of one with respect to the value of the digital signal. The adder 24 used by the sign inverting unit (FIG. 6) of the conventional digital filter device is eliminated. Therefore, it is possible for the present embodiment to provide a reduced size of the entire filter circuit by decreasing the total number of circuit elements built on the chip as the special-application hardware.

Next, a description will be given of an IIR filter device in another embodiment of the present invention with reference to FIGS. 8, 9A and 9B.

As previously described, when a design modification to increase or decrease the number of bits of a digital signal processed by the conventional IIR digital filter is required, it is necessary to completely change the design or layout pattern of the filter circuit with respect to each of circuit elements such as multipliers, adders and registers. It is difficult to realize the design modification of the conventional IIR digital filter since a great amount of the processing time is required.

The IIR filter device of the present embodiment is provided to allow the above-mentioned design modification to be easily performed by constructing the IIR filter device with a plurality of unit filter circuits arranged for respective bits of the digital signal processed by the filter device, rather than with a plurality of circuit elements arranged for respective functions of the filter device.

Figure 8:
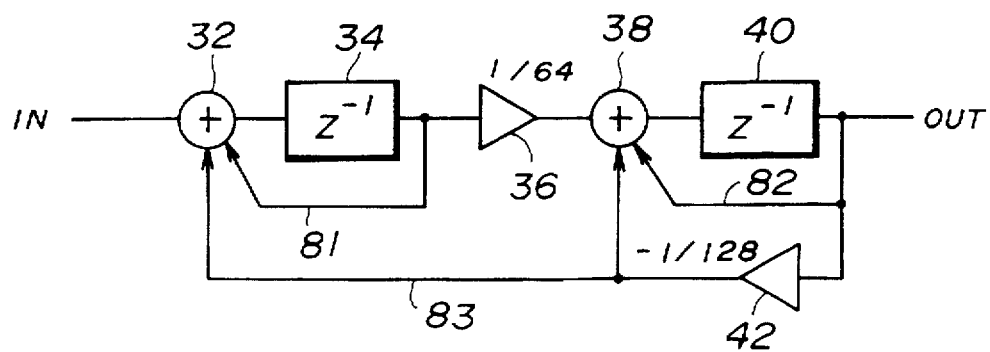
FIG. 8 is a block diagram of an IIR filter device in another embodiment of the present invention.

FIG. 8 shows a second-order IIR filter device in the present embodiment of the invention. Referring to FIG. 8, the IIR filter device comprises an input terminal, an output terminal, at least one feedback line, an adder 32, a delay 34, a $2^{-6}$ coefficient unit 36, an adder 38, a delay 40, and a $-2^{-7}$ coefficient unit 42.

In the present embodiment, three feedback lines are provided: a first feedback line 81, a second feedback line 82, and a third feedback line 83. The first feedback line 81 is connected at one end to an input of the adder 32 and at another end to an output of the delay 34, and no circuit element is provided on the first feedback line 81. The second feedback line 82 is connected at one end to an input of the adder 38 and at another end to an output of the delay 40, and no circuit element is provided on the second feedback line 82. The third feedback line 83 is connected at one end to the output of the delay 40, connected at another end to the input of the adder 38, and connected at a further end to the input of the adder 32.

The $-2^{-7}$ coefficient unit 42 is provided on the third feedback line 83 by connecting an input of the coefficient unit 42 to the output of the delay 40 and connecting an output of the coefficient unit 42 to each of the input of the adder 38 and the input of the adder 32.

In the IIR filter device in FIG. 8, a digital signal at the output of the delay 34 is sent back to the input of the adder 32 as a feedback signal p on the first feedback line 81, and a digital signal at the output of the delay 40 is sent back to the input of the adder 38 as a feedback signal q on the second feedback line 82. Further, the digital signal at the output of the delay 40 is multiplied by the negative value "$-1/128$" ($=-2^{-7}$) by the $-2^{-7}$ coefficient unit 42, and a resulting signal at the output of the coefficient unit 42 is sent back to each of the input of the adder 32 and the input of the adder 38 as a feedback signal r on the third feedback line 83.

As described above, the IIR filter device in FIG. 8 is constructed by using a plurality of unit filter circuits which are arranged for respective bits of the digital signal processed by the filter device, each unit filter circuit being provided for one of the bits of the digital signal.

Figure 9A:
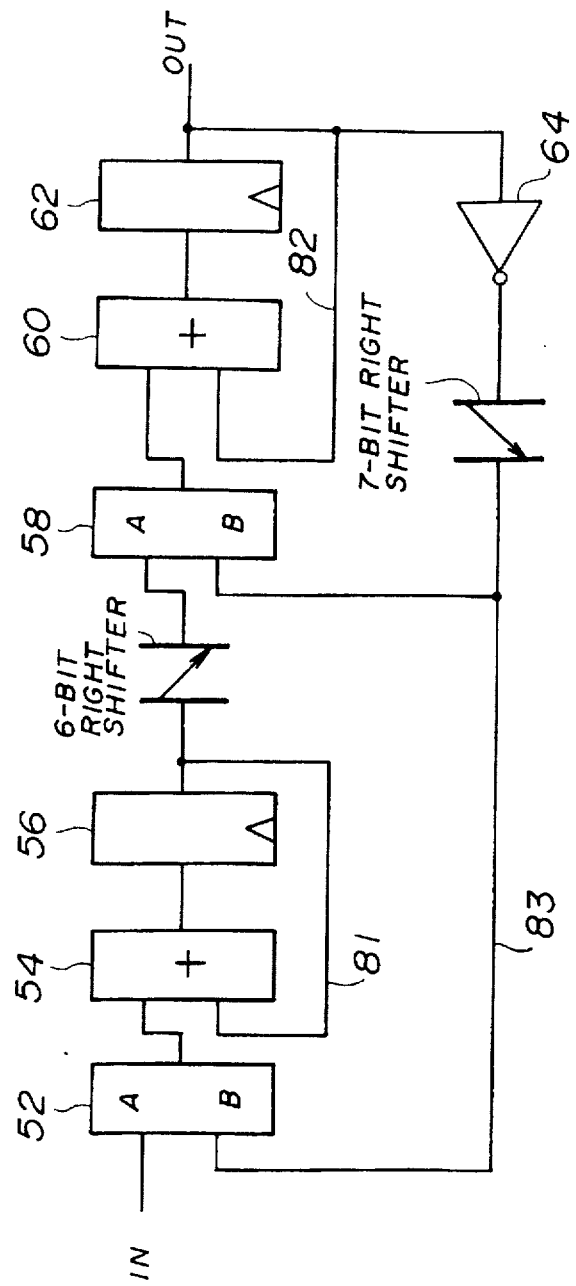
FIGS. 9A and 9B are block diagrams of a plurality of unit filter circuits of the IIR filter device in FIG. 8.
Figure 9B:
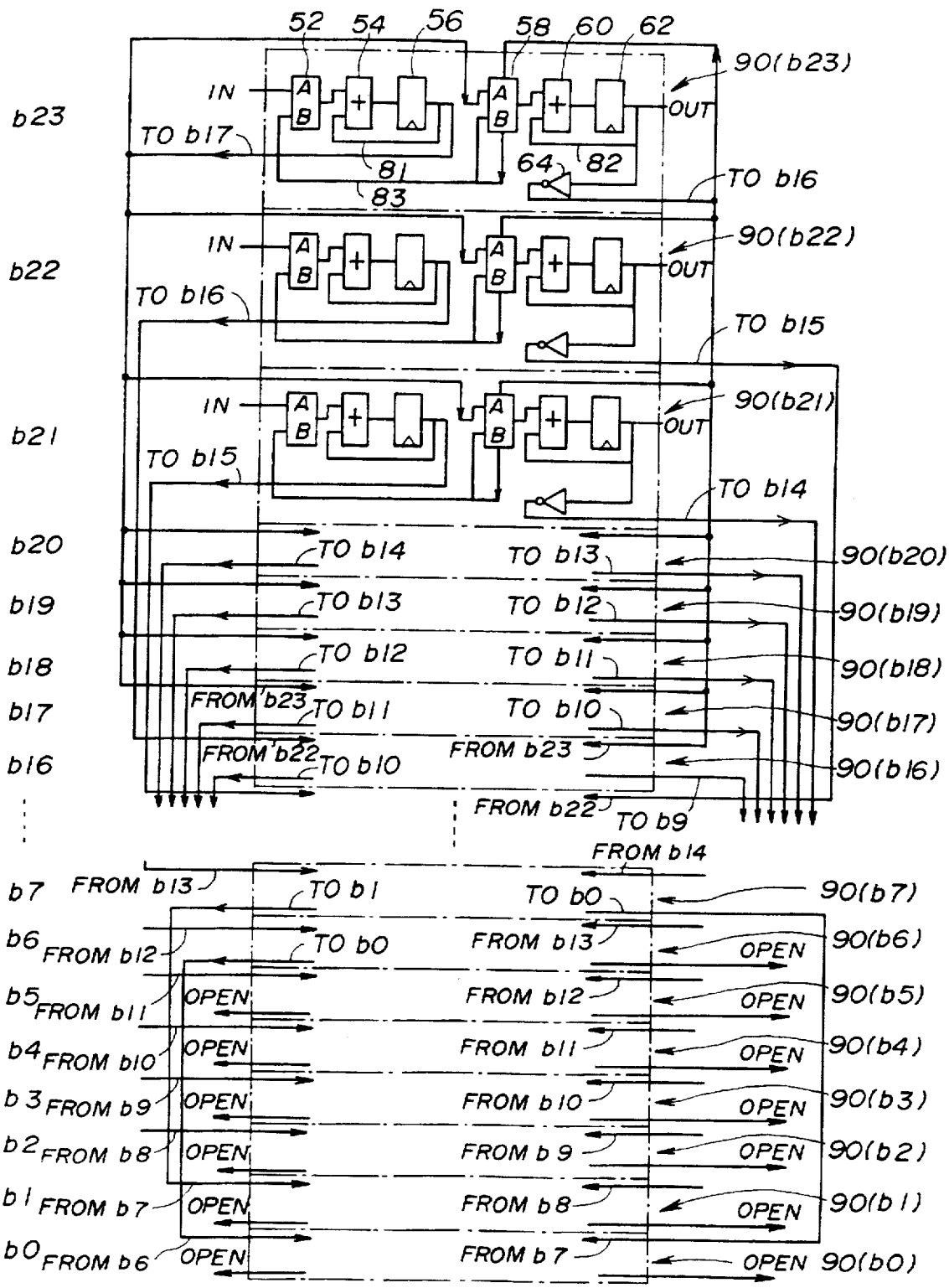

FIGS. 9A and 9B show the plurality of unit filter circuits of the IIR filter device in FIG. 8.

As shown in FIG. 9A, one of the unit filter circuits, which is provided for one of the bits of the digital signal, comprises a selector 52, a unit adder 54, a unit register 56, a selector 58, a unit adder 60, a unit register 62, and a unit inverter 64. In FIG. 9A, a 6-bit right shifter unit for the $2^{-6}$ coefficient unit 36 is provided between an output of the unit register 56 and an input of the selector 58, and a 7-bit right shifter unit for the $-2^{-7}$ coefficient unit 42 is connected to an output of the unit inverter 64. Each of these bit shifter units is constructed by using a plurality of connecting wires which are similar to those shown in FIG. 2, and the thus constructed bit shifter units are separate from the unit filter circuits.

FIG. 9B shows a detailed construction of the IIR filter device in FIG. 8 in a case in which a digital signal processed by the IIR filter device consists of 24 bits. Each of the $2^{-6}$ coefficient unit 36 and the $-2^{-7}$ coefficient unit 42 in FIG. 8 is constructed by using the plurality of connecting wires as shown in FIG. 2.

As shown in FIG. 9B, the IIR filter device of the present embodiment includes a plurality of unit filter circuits "90 (b0)" through "90(b23)" which are arranged for respective bits of the digital signal, each unit filter circuit being provided for one of 24 bits of the digital signal. Most of the unit filter circuits 90(b0) through 90(b23) are indicated by rectangular boxes of one-dotted chain lines in FIG. 9B, for the sake of convenience. The respective bits of the input signal IN are supplied to respective input terminals of the unit filter devices, and the respective bits of the output signal OUT are generated at respective output terminals of the unit filter devices.

For the purpose of simplicity, a description of the construction of the unit filter circuit 90(b23), provided to process only the most significant bit of the digital signal, will be given in the following as a typical example of the unit filter circuits of the IIR filter device of the present embodiment.

Referring to FIG. 9B, the unit filter circuit 90(b23) comprises the selector 52, the unit adder 54, the unit register 56, the selector 58, the unit adder 60, the unit register 62, and the unit inverter 64.

In the unit filter circuit 90(b23), the unit adder 54 processes the bit "b23" of the input signal IN all the bits of which are processed by the adder 32 in FIG. 8. The unit adder 60 processes the bit "b23" of the input signal IN all the bits of which are processed by the adder 38 in FIG. 8. The unit register 56 processes the bit "b23" of the input signal IN all the bits of which are processed by the delay 34 in FIG. 8. The unit register 62 processes the bit "b23" of the input signal IN all the bits of which are processed by the delay 40 in FIG. 8.

The unit register 56 of the unit filter circuit 90(b23) has an output connected to an input (A) of the selector 58 in the unit filter circuit 90(b17) via a connecting wire. An input (A) of the selector 58 in the unit filter circuit unit 90(b23), and respective inputs (A) of the selectors 58 in the unit filter circuit units 90(b22) through 90(17) are commonly connected to each other via connecting wires. A corresponding part of the 6-bit right shifter unit for the $2^{-6}$ coefficient unit 36 in FIG. 8 is constructed in the unit filter circuit 90(b23) with the connecting wires. This bit shifter unit generates an output signal indicating the result of the operation of the multiplication by right shifting of 6 bits in the digital signal.

The unit inverter 64 of the unit filter circuit 90(b23) has an output connected to each of an input (B) of the selector 52 and an input (B) of the selector 58 in the unit filter circuit 90(b16) via connecting wires. The unit inverter 64 corresponds to the sign inverting unit for the $-2^{-7}$ coefficient unit 42 in FIG. 8. An input (B) of the selector 52 and an input (B) of the selector 58 in the unit filter circuit 90(b23), and respective inputs (B) of the selectors 52 and respective inputs (B) of the selectors 58 in the unit filter circuits 90(b22) through 90(b16) are commonly connected to each other via connecting wires. A corresponding part of the 7-bit right shifter unit for the $-2^{-7}$ coefficient unit 42 in FIG. 8 is constructed in the unit filter circuit 90(b23) with the connecting wires. This bit shifter unit generates an output signal indicating the result of the operation of the multiplication by right shifting of 7 bits in the digital signal.

A feedback signal on the first feedback line 81 of the unit filter circuit 90(b23), supplied from the unit register 56 to the unit adder 54, corresponds to one bit of the feedback signal p on the first feedback line 81 in FIG. 8. A feedback signal on the second feedback line 82 of the unit filter circuit 90(b23), supplied from the unit register 62 to the unit adder 60, corresponds to one bit of the feedback signal q on the second feedback line 82 in FIG. 8. A feedback signal on the third feedback line 83 of the unit filter circuit 90(b23), supplied from the unit inverter 64 to each of the selector 52 of the selector 58 via the bit shifter unit, corresponds to one bit of the feedback signal r on the third feedback line 83 in FIG. 8.

In the present embodiment, the selector 52 supplies one of the two bit signals at the inputs A and B of the selector 52 to the unit adder 54 by time division control. Therefore, by the time division control, one of the two operations of the addition between the input signal IN and the signal from the first feedback line 81 and the addition between the signal from the feedback line 83 and the signal from the feedback line 81 is performed by the unit adder 54. Also, the selector 58 supplies one of the two bit signals at the inputs A and B of the selector 58 to the unit adder 60 by time division control. By this time division control, one of the two operations of the addition between the signal from the 6-bit right shifter unit and the signal from the second feedback line 82 and the addition between the signal from the 7-bit right shifter unit and the signal from the second feedback line 82 is performed by the unit adder 60.

In a case in which the above-mentioned operations of the addition are simultaneously performed not by the time division control, unit adders having three input terminals are used instead of the unit adders 54 and 60. In such a case, the selector 52 and the selector 58 are not required for the unit filter circuit 90(b23).

In the present embodiment, additional connecting wires, which are not shown in FIGS. 9A and 9B, are provided between the unit filter circuits. These connecting wires are used to transmit "carry" signals from the unit adders 54 and 60 thereon.

The IIR filter device of the present embodiment in FIG. 8 is constructed by using the plurality of unit filter circuits provided for the respective bits of the digital signal, the plurality of connecting wires provided for the bit shifter units, and the above-mentioned additional connecting wires for transmitting the carry signals.

In the above-described embodiment, the digital filter device includes the plurality of unit filter circuits which generate the output signal indicating the result of the filtering operation of respective bits of the digital signal processed by the filter device. Since the number of the unit filter circuits included in the digital filter device can be easily increased or decreased by changing the layout of the connecting wires, it is possible for the present embodiment to easily carry out a design modification for increasing or decreasing the number of bits of the digital signal to be processed, with a reduction of the processing time.

In addition, when the circuit elements of the digital filter device are built on the IC chip as the hardware, the layout of the entire filter circuit can be made by repeating the pattern of the unit filter circuit regularly. It is possible for the present embodiment to easily create the design of the layout of the entire filter circuit on the chip. Also, in the present embodiment, the area of the digital filter device on the chip can be easily reduced.

Further, the present invention is not limited to the above-described embodiments, and variations and modifications may be made without departing from the scope of the present invention.

What is claimed is:

1. A digital filter device comprising:

an adder;

a delay connected to said adder;

at least one feedback line connected at one end to an output of said delay and at another end to an input of said adder;

a sign inverting unit generating a sign-inverted value of a digital signal at an input of the sign inverting unit; and a bit shifter unit generating a result of an operation of multiplication on a number in the form of $2^{-n}$ where n is a non-negative integer and a value of a digital signal at an input of the bit shifter unit, said bit shifter unit generating an output signal indicating the result of the operation by right shifting of n bits in the digital signal and by truncating n least significant bits of the digital signal.

2. The device according to claim 1, wherein said sign inverting unit generates a complement of one with respect to a value of the digital signal at the input of the sign inverting unit.

3. The device according to claim 1, wherein said bit shifter unit comprises a plurality of connecting wires corresponding to respective bits of the digital signal at the input of the bit shifting unit.

4. The device according to claim 1, wherein said sign inverting unit has an output connected to an input of said bit shifter unit, and said bit shifter unit has an output connected to the input of said adder.

5. The device according to claim 1, wherein each of coefficients of a transfer function of said digital filter device is represented by a number in the form of $2^{-n}$ or $-2^{-n}$.

6. The device according to claim 1, wherein said digital filter device generates a result of a filtering operation of a digital signal by using a fixed-point representation.

7. A digital filter device comprising:

a plurality of unit filter circuits generating an output signal indicating a result of a filtering operation of respective bits of a digital signal, wherein each unit filter circuit is provided for one of the bits of the digital signal and comprises a unit adder, a unit register connected to said unit adder, and at least one feedback line connected at one end to an output of said unit register and at another end to an input of said unit adder; and a bit shifter unit generating a result of an operation of multiplication on a number in the form of $2^{-n}$ where n is a non-negative integer and a value of a digital signal at an input of the bit shifter unit, said bit shifter unit generating an output signal indicating the result of the operation by right shifting of n bits in the digital signal and by truncating n least significant bits of the digital signal.

8. The device according to claim 7, wherein each of coefficients of a transfer function of said digital filter device is represented by a number in the form of $2^{-n}$ or $-2^{-n}$.

9. The device according to claim 7, wherein said digital filter device generates the result of the filtering operation of the digital signal by using a fixed-point representation.

10. The device according to claim 7, further comprising a sign inverting unit generating a sign-inverted value of a digital signal at an input of the sign inverting unit.

11. The device according to claim 10, wherein said sign inverting unit generates a complement of one with respect to a value of the digital signal.

12. The device according to claim 7, wherein said bit shifter unit comprises a plurality of connecting wires corresponding to respective bits of the digital signal at the input of the bit shifter unit.

* * * * *